(12) United States Patent
Haga et al.

(10) Patent No.: US 7,825,498 B2
(45) Date of Patent: Nov. 2, 2010

(54) SEMICONDUCTOR DEVICE

(75) Inventors: Motoharu Haga, Kyoto (JP); Yasumasa Kasuya, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 129 days.

(21) Appl. No.: 11/902,304

(22) Filed: Sep. 20, 2007

(65) Prior Publication Data
US 2008/0179737 A1 Jul. 31, 2008

(30) Foreign Application Priority Data
Oct. 3, 2006 (JP) ............................. 2006-272126

(51) Int. Cl.
*H01L 23/36* (2006.01)

(52) U.S. Cl. ............... 257/667; 257/787; 257/E23.101; 438/106

(58) Field of Classification Search ................. 257/667, 257/672, 787, E23.101; 438/106; *H01L 23/36*
See application file for complete search history.

(56) References Cited

U.S. PATENT DOCUMENTS

| | | | | |
|---|---|---|---|---|
| 6,038,137 | A | * | 3/2000 | Bhatt et al. ................. 361/795 |
| 7,126,210 | B2 | * | 10/2006 | Chiu et al. ................. 257/667 |
| 2003/0052420 | A1 | * | 3/2003 | Suzuki et al. .............. 257/787 |
| 2003/0057534 | A1 | * | 3/2003 | Ho et al. .................... 257/678 |
| 2004/0212051 | A1 | * | 10/2004 | Zhao et al. ................. 257/672 |
| 2005/0186704 | A1 | * | 8/2005 | Yee et al. ................... 438/106 |

FOREIGN PATENT DOCUMENTS

| | | |
|---|---|---|
| JP | 11-154717 | 6/1999 |
| JP | 2001-181563 | 7/2001 |
| JP | 06-339596 | * 6/2005 |
| JP | 6339596 A | * 12/2006 |

* cited by examiner

*Primary Examiner*—Steven J Fulk
(74) *Attorney, Agent, or Firm*—Rabin & Berdo, PC

(57) ABSTRACT

A semiconductor device according to the present invention includes an island provided on one surface of a resin substrate, an external terminal provided on the other surface of the substrate, a thermal pad provided on the other surface of the substrate in opposed relation to the island, a heat conduction portion extending through the substrate from the one surface to the other surface to connect the island to the thermal pad in a thermally conductive manner, and a solder resist portion provided on the other surface of the substrate and having a heat dissipation opening which defines a gap with respect to an outer periphery of the thermal pad and a terminal opening which exposes the external terminal.

33 Claims, 6 Drawing Sheets

SEMICONDUCTOR DEVICE

BACKGROUND OF THE INVENTION

1. Field of the Invention

The present invention relates to a semiconductor device and, more specifically, to a BGA (Ball Grid Array) semiconductor device and an LGA (Land Grid Array) semiconductor device.

2. Description of Related Art

Surface-mountable packages which permit surface mounting of semiconductor devices on a wiring board are frequently used for increasing the integration density of the semiconductor devices on the wiring board. BGA packages are known as typical examples of such surface-mountable packages.

A BGA semiconductor device employing a BGA package includes a substrate and a semiconductor chip mounted on the substrate. The substrate is, for example, an insulative substrate of a glass epoxy resin. Provided on one surface of the insulative substrate are an island on which a semiconductor chip is bonded, and internal terminals respectively electrically connected to pads on a surface of the semiconductor chip via bonding wires.

Provided on the other surface of the insulative substrate are ball-shaped external terminals for electrical connection to lands (electrodes) provided on a mount board (printed wiring board).

The insulative substrate has through-holes extending therethrough from the one surface to the other surface thereof. The through-holes are filled with a metal material. The internal terminals on the one surface of the insulative substrate are respectively electrically connected to the external terminals on the other surface via metal portions provided in the through-holes. The components provided on the one surface of the insulative substrate are sealed with a resin package, and thereby protected from external environmental influences (e.g., moisture and the like).

A recent trend toward the multi-functionality of the semiconductor chip has presented problems associated with a temperature increase due to heat generated by the semiconductor chip. If the heat generated by the semiconductor chip remains in the semiconductor device (in the resin package), for example, inconveniences such as deterioration of the components and malfunction of the semiconductor chip may result. In the future, the integration density of semiconductor chips will be further increased, thereby aggravating these problems.

SUMMARY OF THE INVENTION

It is an object of the present invention to provide a semiconductor device which is capable of efficiently dissipating heat generated by a semiconductor chip thereof to the outside.

A semiconductor device according to one aspect of the present invention includes a resin substrate, an island provided on one surface of the substrate, a semiconductor chip die-bonded onto the island, an internal terminal provided on the one surface of the substrate and electrically connected to the semiconductor chip, an external terminal provided on the other surface of the substrate opposite from the one surface in opposed relation to the internal terminal, an inter-terminal connection via extending through the substrate from the one surface to the other surface of the substrate to connect the internal terminal to the external terminal in an electrically conductive manner, a thermal pad provided on the other surface of the substrate in opposed relation to the island, a heat conduction portion extending through the substrate from the one surface to the other surface of the substrate to connect the island to the thermal pad in a thermally conductive manner, and a solder resist portion provided on the other surface of the substrate and having a heat dissipation opening which defines a gap with respect to an outer periphery of the thermal pad and a terminal opening which exposes the external terminal.

With this arrangement, the semiconductor chip is electrically connected to the internal terminal on the one surface of the substrate. The internal terminal is connected to the external terminal on the other surface through the inter-terminal connection via in an electrically conductive manner. Therefore, where the external terminal is electrically connected to a land provided on a mount board, the semiconductor chip is electrically connected to the land, and is operated by electric power supplied from the land.

The semiconductor chip is die-bonded onto the island. The island is connected to the heat conduction portion and the thermal pad in a thermally conductive manner. The thermal pad is exposed from the heat dissipation opening of the solder resist portion. Therefore, heat generated by the semiconductor chip is transferred to the thermal pad through the island and the heat conduction portion, and dissipated from an exposed surface of the thermal pad to the outside. That is, heat generated when the semiconductor chip operates is efficiently dissipated to the outside without remaining in the semiconductor device.

A semiconductor device according to another aspect of the present invention includes a resin substrate, an island provided on one surface of the substrate, a semiconductor chip die-bonded onto the island, an internal terminal provided on the one surface of the substrate and electrically connected to the semiconductor chip, an external terminal provided on the other surface of the substrate opposite from the one surface in opposed relation to the internal terminal, an inter-terminal connection via extending through the substrate from the one surface to the other surface of the substrate to connect the internal terminal to the external terminal in an electrically conductive manner, a thermal pad provided on the other surface of the substrate in opposed relation to the island, a heat conduction portion extending through the substrate from the one surface to the other surface of the substrate to connect the island to the thermal pad in a thermally conductive manner, and a solder resist portion provided on the other surface of the substrate and having a heat dissipation opening which exposes a center portion of the thermal pad with a peripheral edge thereof being located on a peripheral portion of the thermal pad and a terminal opening which exposes the external terminal.

With this arrangement, the semiconductor chip is electrically connected to the internal terminal on the one surface of the substrate. The internal terminal is connected to the external terminal on the other surface through the inter-terminal connection via in an electrically conductive manner. Therefore, where the external terminal is electrically connected to a land provided on a mount board, the semiconductor chip is electrically connected to the land, and is operated by electric power supplied from the land.

The semiconductor chip is die-bonded onto the island. The island is connected to the heat conduction portion and the thermal pad in a thermally conductive manner. The thermal pad is exposed from the heat dissipation opening of the solder resist portion. Therefore, heat generated by the semiconductor chip is transferred to the thermal pad through the island and the heat conduction portion, and dissipated from an exposed surface of the thermal pad to the outside. That is, heat generated when the semiconductor chip operates is efficiently dissipated to the outside without remaining in the semiconductor device.

For formation of the solder resist portion having the openings on the substrate, a solder resist is first applied over the entire surface of the substrate. In turn, a mask film having openings corresponding to the heat dissipation opening and the terminal opening is transferred onto the solder resist. Then, the solder resist is patterned (etched) with the use of the mask film as a mask, whereby the solder resist portion having the heat dissipation opening and the terminal opening is formed.

The mask film has a mask pattern in which the center of the opening for the heat dissipation opening is spaced a predetermined distance from the center of the opening for the terminal opening. Therefore, a distance between the centers of the heat dissipation opening and the terminal opening formed by the patterning employing the mask film as the mask is constant.

Therefore, even if the mask film is transferred onto the solder resist in an offset relation with respect to the substrate, a distance between the center of a portion of the thermal pad exposed from the heat dissipation opening and the center of a portion of the external terminal exposed from the terminal opening is constant. As a result, the center of the portion of the thermal pad exposed from the heat dissipation opening is located in constant positional relation with respect to the land of the mount board when the semiconductor device is mounted on the mount board with reference to the thermal pad. Therefore, the external terminal is reliably brought into contact with the land.

The heat conduction portion preferably includes a heat conduction opening extending through the substrate, a heat conduction layer covering a side surface of the heat conduction opening, and a thermally conductive material portion embedded in the heat conduction opening.

With this arrangement, the side surface of the heat conduction opening is covered with the heat conduction layer. Further, the thermally conductive material portion is embedded in the heat conduction opening. With the thermally conductive material portion thus embedded in the heat conduction opening, the heat dissipation property is improved over a case in which the inside of the heat conduction opening is empty.

The thermally conductive material portion is preferably composed of a copper-containing material.

Since copper has higher thermal conductivity, heat transferred from the semiconductor chip to the island is efficiently further transferred to the thermal pad through the thermally conductive material portion of the copper-containing material. As a result, the heat dissipation property is further improved.

The heat conduction portion may include a plurality of heat conduction portions.

The semiconductor device preferably further includes a thermal terminal provided on a surface of the thermal pad opposite from the substrate and adapted to be connected to a ground electrode provided on the mount board when the semiconductor device is mounted on the mount board.

With this arrangement, the thermal terminal is connected to the ground electrode on the mount board when the semiconductor device is mounted on the mount board. The provision of the thermal terminal makes it possible to electrically connect the semiconductor chip to the ground electrode via the island, the heat conduction portion, the thermal pad and the thermal terminal. As a result, a rear surface of the semiconductor chip is kept at a ground potential when the semiconductor device is mounted on the mount board. Therefore, a semiconductor chip formed with a power IC and operative with its rear surface grounded may be employed as the semiconductor chip. In this case, proper operation of the semiconductor chip (e.g., proper operation of the power IC) is ensured. Since the thermal terminal is connected to the ground electrode, the heat transferred to the thermal pad is released to the mount board through the thermal terminal.

The foregoing and other objects, features and effects of the present invention will become more apparent from the following detailed description of the preferred embodiments with reference to the attached drawings.

DETAILED DESCRIPTION OF PREFERRED EMBODIMENTS

Embodiments of the present invention will hereinafter be described in detail with reference to the attached drawings.

Figure 1:
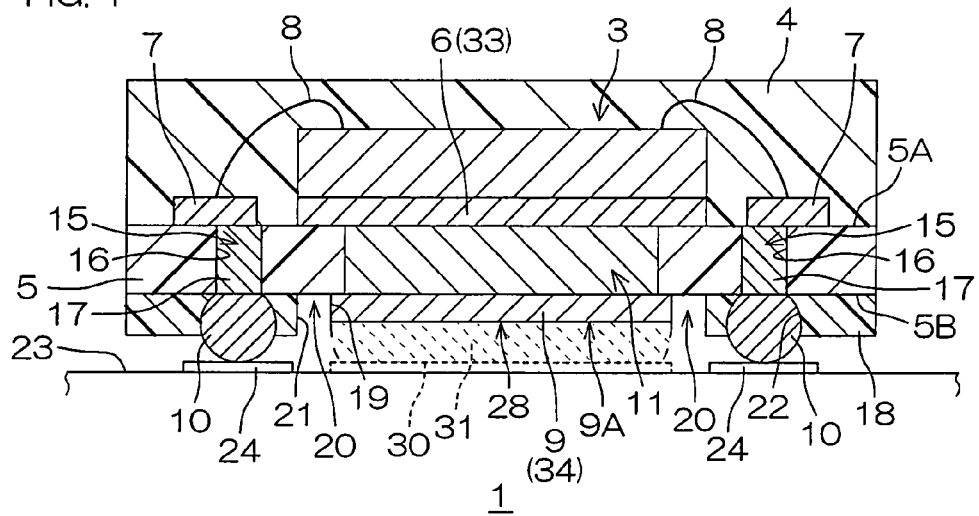
FIG. 1 is a schematic sectional view showing the construction of a semiconductor device according to one embodiment of the present invention.
Figure 2:
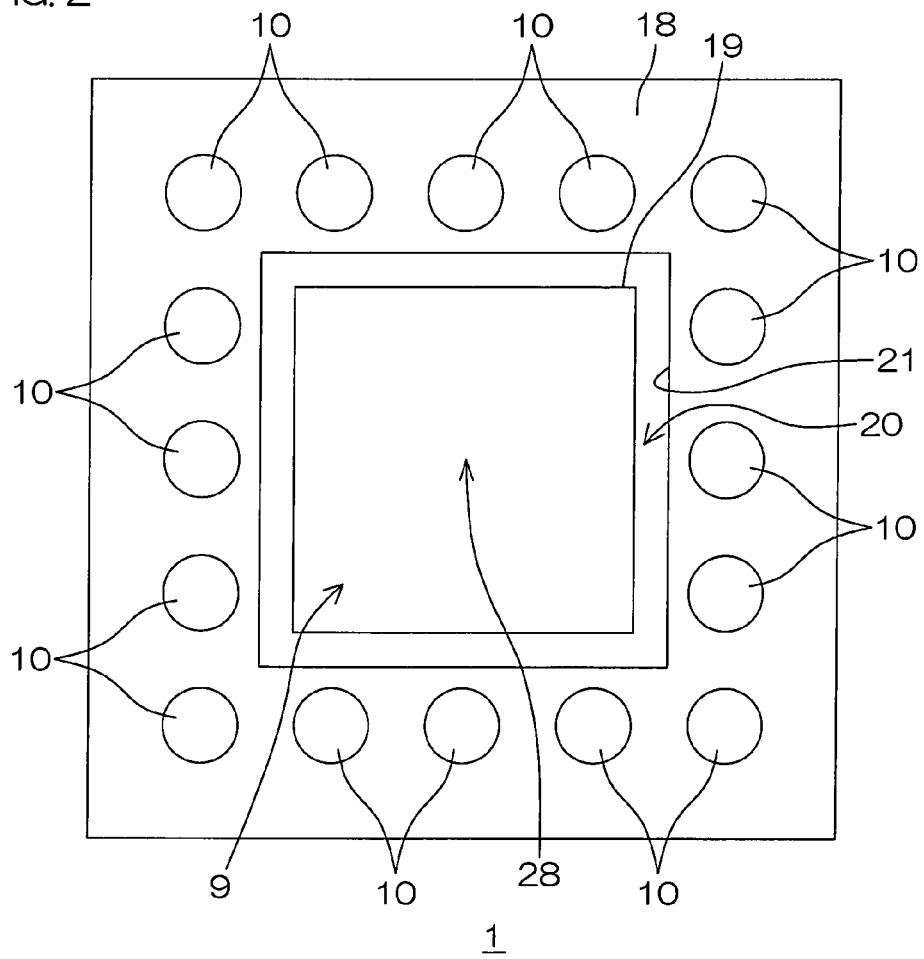
FIG. 2 is a schematic plan view illustrating a surface of the semiconductor device of FIG. 1 to be opposed to a mount board.

FIG. 1 is a schematic sectional view showing the construction of a semiconductor device according to one embodiment of the present invention. FIG. 2 is a schematic plan view illustrating a surface of the semiconductor device of FIG. 1 to be opposed to a mount board.

The semiconductor device 1 is a semiconductor device employing a BGA (Ball Grid Array) package, and includes an insulative substrate 5 of an insulative resin (e.g., a glass epoxy resin), a semiconductor chip 3 mounted on the insulative substrate 5, and a resin seal 4 which seals the semiconductor chip 3 and one surface 5A of the insulative substrate 5 opposed to the semiconductor chip 3.

An island 6 and internal terminals 7 are provided on the one surface 5A of the insulative substrate 5.

The island 6 is composed of a metal material (e.g., copper or the like) having electrical conductivity and thermal conductivity. The island 6 is disposed on a center portion of the one surface 5A of the insulative substrate 5, and is of a rectangular thin plate shape having substantially the same size as the semiconductor chip 3 as seen in plan.

The internal terminals 7 are composed of the same metal material (e.g., copper or the like) as the island 6. The internal terminals 7 are disposed on a peripheral portion of the one surface 5A of the insulative substrate 5 as surrounding the island 6.

A rear surface of the semiconductor chip 3 is bonded (die-bonded) onto the island 6, for example, with a bonding agent (not shown) of a high-melting point solder (having a melting point of not lower than 260° C.) in a thermally conductive manner.

A semiconductor substrate (e.g., a silicon substrate) as a base of the semiconductor chip 3 is formed, for example, with a power IC. An outermost surface of the semiconductor chip 3 is covered with a surface protective film. A plurality of pads (not show) are provided on the semiconductor substrate as being exposed from the surface protective film. These pads are respectively connected (wire-bonded) to the internal terminals 7, for example, via bonding wires 8 such as thin gold wires. Thus, the rear surface of the semiconductor chip 3 is connected to the island 6 in an electrically and thermally conductive manner, while an internal circuit (not shown) of the semiconductor chip 3 is connected to the internal terminals 7 via the bonding wires 8 in an electrically conductive manner.

A thermal pad 9 and external terminals 10 are provided on the other surface 5B of the insulative substrate 5.

The thermal pad 9 is composed of the same metal material (e.g., copper or the like) as the island 6, and disposed on a center portion of the other surface 5B of the insulative substrate 5 (in opposed relation to the island 6 with the intervention of the insulative substrate 5). The thermal pad 9 has substantially the same shape (plan shape and thickness) as the island 6.

The external terminals 10 each have a ball shape, and are composed of a metal material such as a solder. The external terminals 10 are respectively opposed to the corresponding internal terminals 7 with the intervention of the insulative substrate 5. As shown in FIG. 2, the external terminals 10 are arranged alongside peripheral edges of the other surface 5B of the insulative substrate 5 as surrounding the thermal pad 9. Further, the external terminals 10 partly project from a solder resist portion 18 as will be described later.

A single thermal via 11, which serves as a heat conduction portion for connecting the island 6 to the thermal pad 9 in a thermally conductive manner, extends through the insulative substrate 5 between the island 6 and the thermal pad 9.

Figure 3:
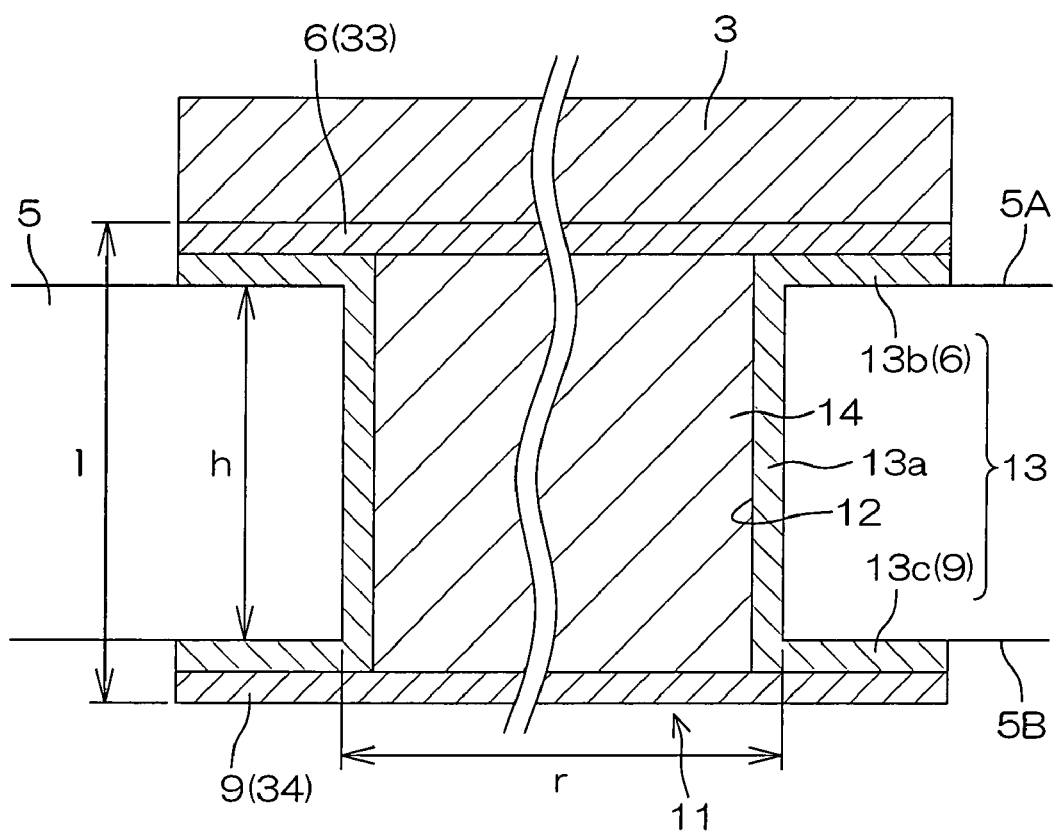
FIG. 3 is an enlarged view specifically illustrating a thermal via.

FIG. 3 is an enlarged view specifically illustrating the thermal via 11.

Referring to FIG. 3, the thermal via 11 includes a heat conduction opening 12 extending through the insulative substrate 5, a plating layer 13 serving as a heat conduction layer, and a thermally conductive material portion 14 embedded in the heat conduction opening 12.

The heat conduction opening 12 has an aspect ratio of 1.0 to 1.5, for example, which is defined as a ratio of the thickness h to the width r of the opening. Where the aspect ratio of the heat conduction opening 12 is in the aforementioned range, heat transferred to the island 6 is efficiently further transferred to the thermal pad 9, so that the heat dissipation property can be improved.

The plating layer 13 is a layer formed by plating with a thermally conductive metal material (e.g., copper or the like).

The plating layer 13 unitarily includes a plating layer portion 13a covering the side surface of the heat conduction opening 12, a plating layer portion 13b provided as a part of the island 6 on the one surface 5A of the insulative substrate 5 around the heat conduction opening 12, and a plating layer portion 13c provided as a part of the thermal pad 9 on the other surface 5B of the insulative substrate 5 around the heat conduction opening 12.

The thermally conductive material portion 14 is composed of a thermally conductive material. Examples of the thermally conductive material include thermally conductive metal materials (e.g., copper and the like), resin materials plated with a metal, and materials obtained by dispersing metal particles in a resin matrix. Used as the material for the thermally conductive material portion 14 is preferably a thermally conductive metal material (e.g., copper), more preferably copper. Since copper has higher thermal conductivity, the heat transferred from the semiconductor chip 3 to the island 6 is efficiently further transferred to the thermal pad 9 through the thermally conductive material portion 14 of copper. As a result, the heat dissipation property is further improved.

The insulative substrate 5 is a double-sided substrate which includes a conductive layer 33 including the island 6 provided on the one surface 5A of the insulative substrate 5, and a conductive layer 34 including the thermal pad 9 provided on the other surface 5B of the insulative substrate 5. Therefore, heat generated by the semiconductor chip 3 is conducted from the island 6 to the thermal pad 9 for a short distance 1 and, hence, efficiently dissipated.

Referring again to FIGS. 1 and 2, the insulative substrate 5 has inter-terminal connection vias 15 extending therethrough between the internal terminals 7 and the external terminals 10 to respectively connect the internal terminals 7 to the external terminals 10 in an electrically conductive manner.

The inter-connection vias 15 are formed, for example, by forming via-holes 16 extending through the insulative substrate 5 and filling an electrically conductive material 17 (e.g., copper) in these via-holes 16. Thus, the internal terminals 7 are respectively electrically connected to the external terminals 10.

The solder resist portion 18 is provided on the other surface 5B of the insulative substrate 5.

The solder resist portion 18 has a heat dissipation opening 21 which defines a gap 20 with respect to an outer periphery 19 of the thermal pad 9, and terminal openings 22 which expose the external terminals 10. Since the thermal pad 9 is exposed from the heat dissipation opening 21, the heat transferred to the thermal pad 9 is dissipated to the outside. That is, heat generated when the semiconductor chip 3 operates is efficiently dissipated to the outside without remaining in the semiconductor device 1.

The surface mounting of the semiconductor device 1 on a mount board 23 is achieved by positioning the semiconductor device 1 with the other surface 5B of the insulative substrate 5 thereof opposed to the mount board 23 and respectively connecting the external terminals 10 to lands 24 provided on the mount board 23. More specifically, the internal terminals 7 on the one surface 5A of the insulative substrate 5 are respectively electrically connected to the external terminals 10 on the other surface 5B of the insulative substrate 5 through the inter-terminal connection vias 15. Therefore, electrical connection between the lands 24 and the internal terminals 7 and, hence, electrical connection between the lands 24 and the semiconductor chip 3 are achieved by connecting the external terminals 10 to the lands 24 provided on the mount board 23. Thus, the semiconductor chip 3 is operated by electric power supplied from the lands 24.

The heat generated when the semiconductor chip 3 operates is transferred to the thermal pad 9 through the island 6 and the thermal via 11, and dissipated from an exposed surface 9A of the thermal pad 9 to the outside. Therefore, the semiconductor chip 3 operates, while the heat generated by the semiconductor chip 3 is efficiently dissipated to the outside without remaining in the semiconductor device 1. As a result, deterioration of the components and malfunction of the semiconductor chip 3 can be suppressed.

Where a ground electrode 30 is provided on the mount board 23, a thermal terminal 31 of a metal material such as a solder may be provided on the exposed surface 9A of the thermal pad 9.

In this case, a lower surface of the thermal terminal 31 is located at the same height level as lower surfaces of the external terminals 10. Thus, the thermal terminal 31 is connected to the ground electrode 30 on the mount board 23, when the semiconductor device 1 is mounted on the mount board 23. Therefore, the rear surface of the semiconductor chip 3 is electrically connected to the ground electrode 30 through the island 6, the thermal via 11, the thermal pad 9 and the thermal terminal 31. As a result, the rear surface of the semiconductor chip 3 is kept at a ground potential.

Therefore, a semiconductor chip formed with a power IC and operative with its rear surface grounded, for example, may be used as the semiconductor chip 3. In this case, proper operation of the semiconductor chip (e.g., proper operation of the power IC) is ensured. Since the thermal terminal 31 is connected to the ground electrode 30, the heat transferred to the thermal pad 9 is released to the mount board 23 through the thermal terminal 31.

Figure 4A:
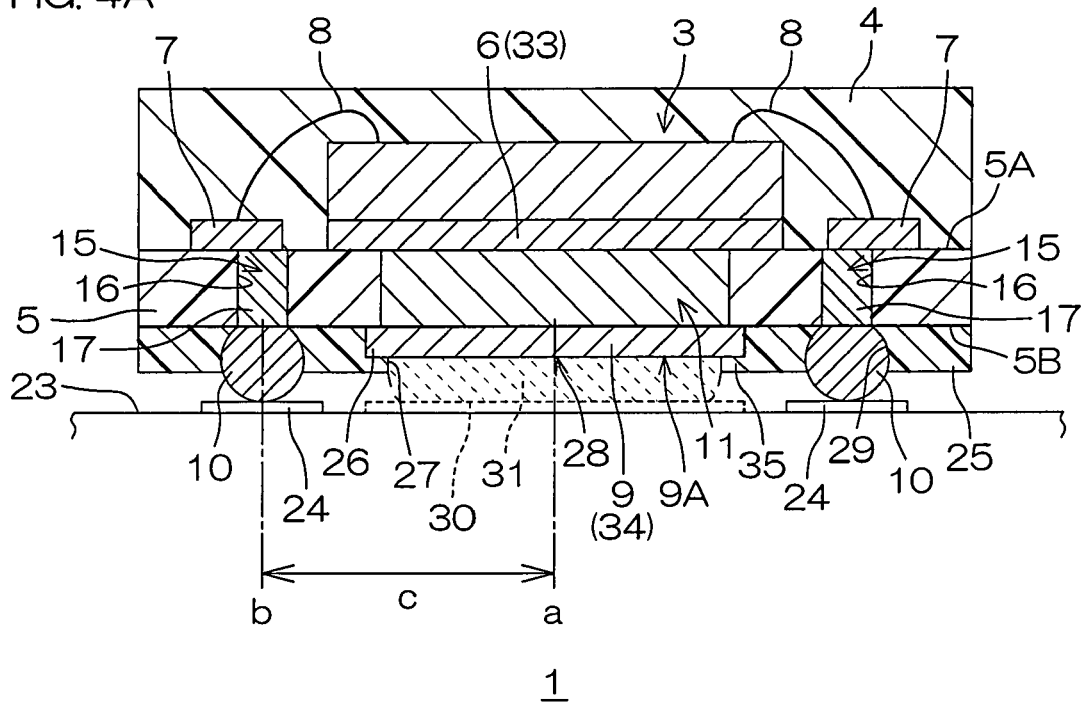
FIG. 4A is a schematic sectional view showing the construction of a semiconductor device according to a second embodiment of the present invention, in which a solder resist portion has a non-offset opening.
Figure 4B:
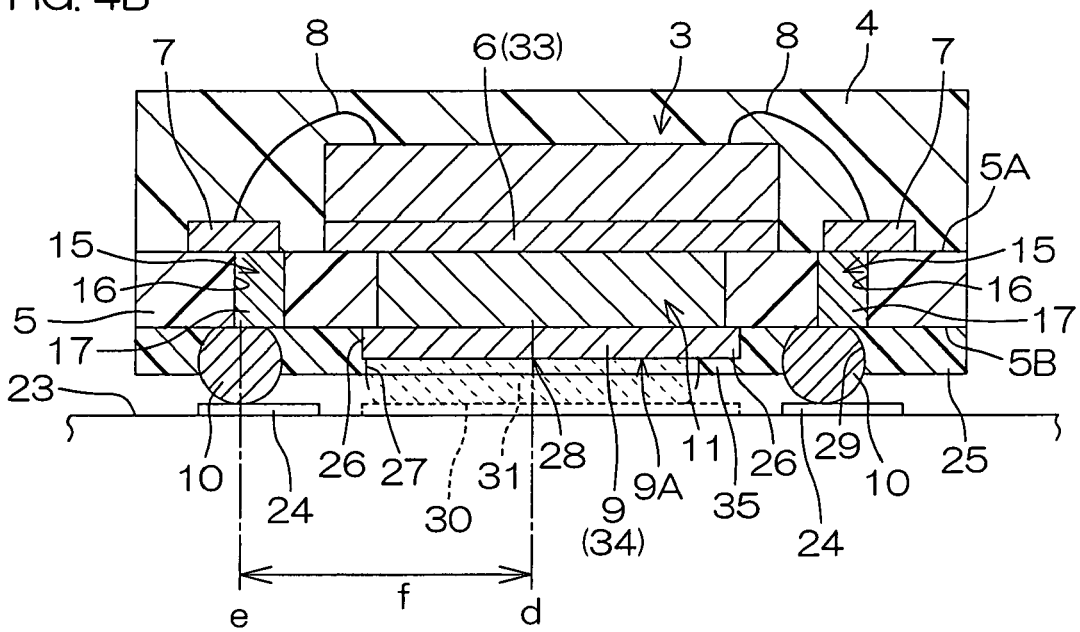
FIG. 4B is a schematic sectional view showing the construction of another semiconductor device according to the second embodiment of the present invention, in which a solder resist portion has an offset opening.

FIG. 4A is a schematic sectional view showing the construction of a semiconductor device according to a second embodiment of the present invention, in which a solder resist portion 25 (to be described later) has a non-offset opening. FIG. 4B is a schematic sectional view showing the construction of another semiconductor device according to the second embodiment of the present invention, in which a solder resist portion 25 (to be described later) has an offset opening.

Figure 5:
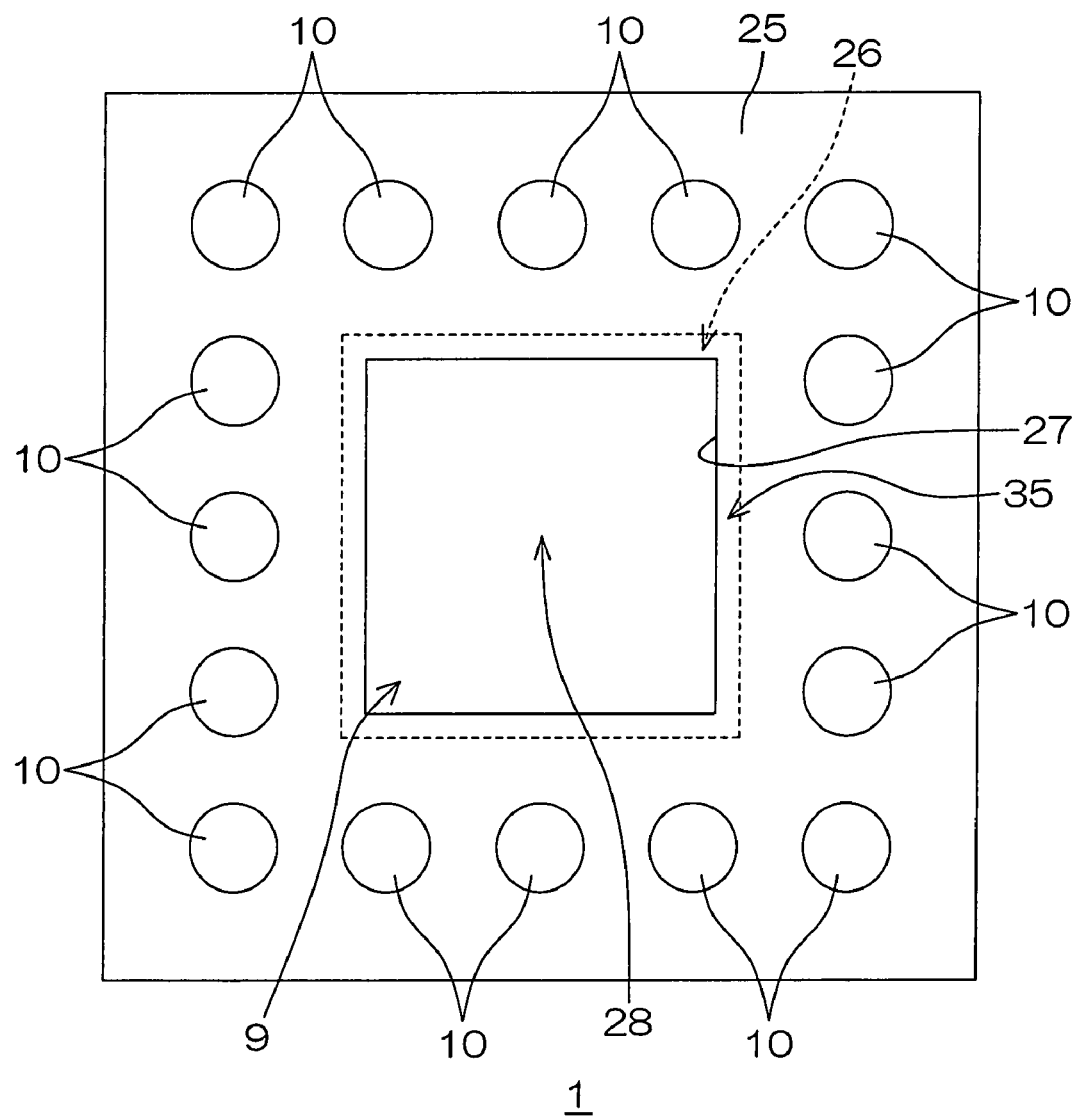
FIG. 5 is a schematic plan view illustrating a surface of the semiconductor device of FIG. 4A to be opposed to a mount board.
Figure 6:
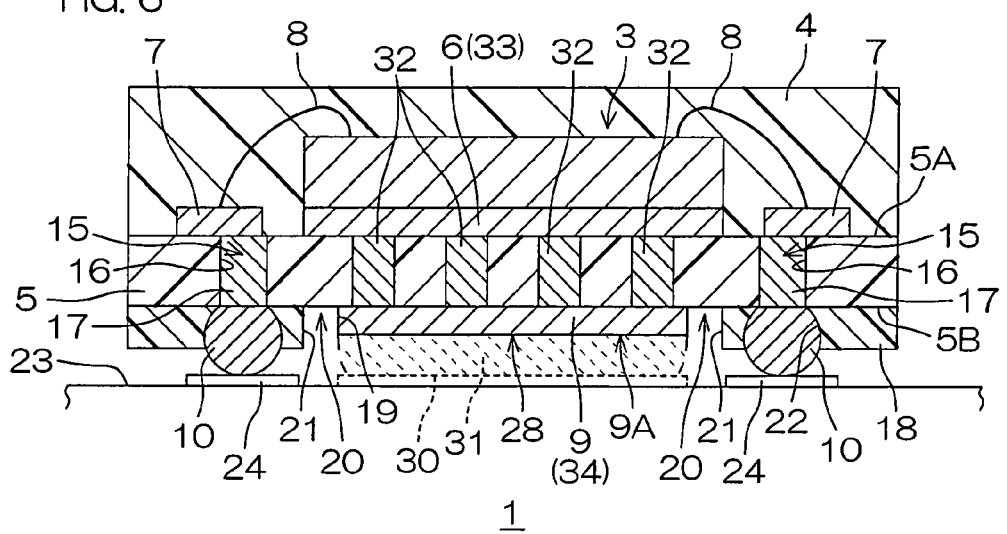
FIG. 6 is a schematic sectional view showing the construction of a semiconductor device which is a modification of the semiconductor device shown in FIG. 1.
Figure 7:
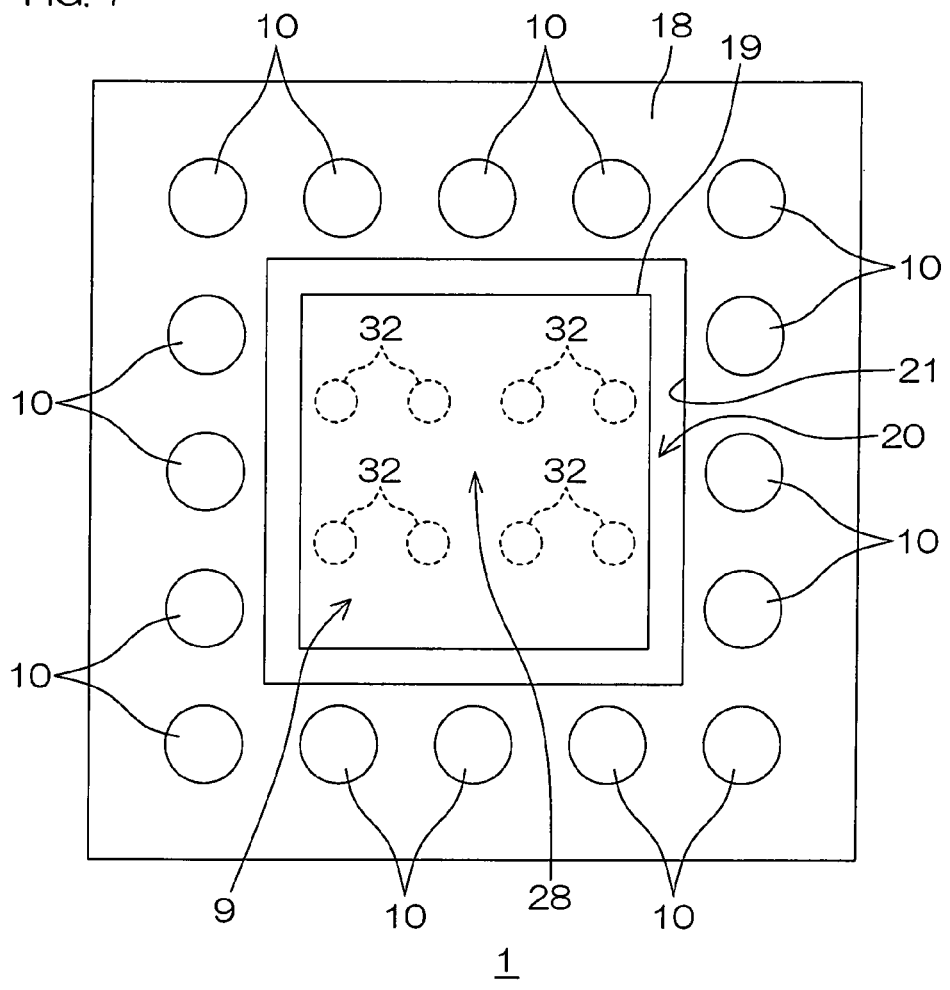
FIG. 7 is a schematic plan view illustrating a surface of the semiconductor device of FIG. 6 to be opposed to a mount board.
Figure 8:
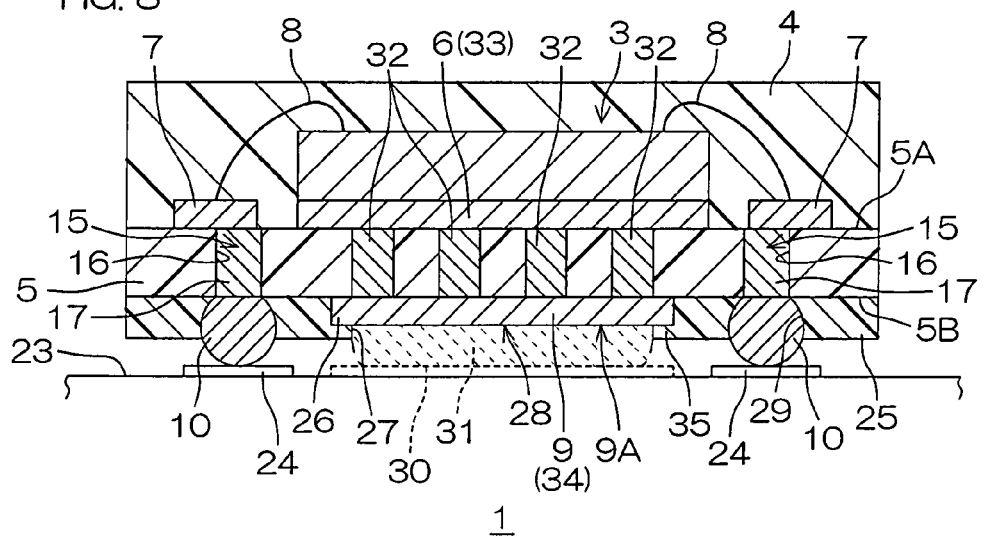
FIG. 8 is a schematic sectional view showing the construction of a semiconductor device which is a modification of the semiconductor device shown in FIG. 4A.
Figure 9:
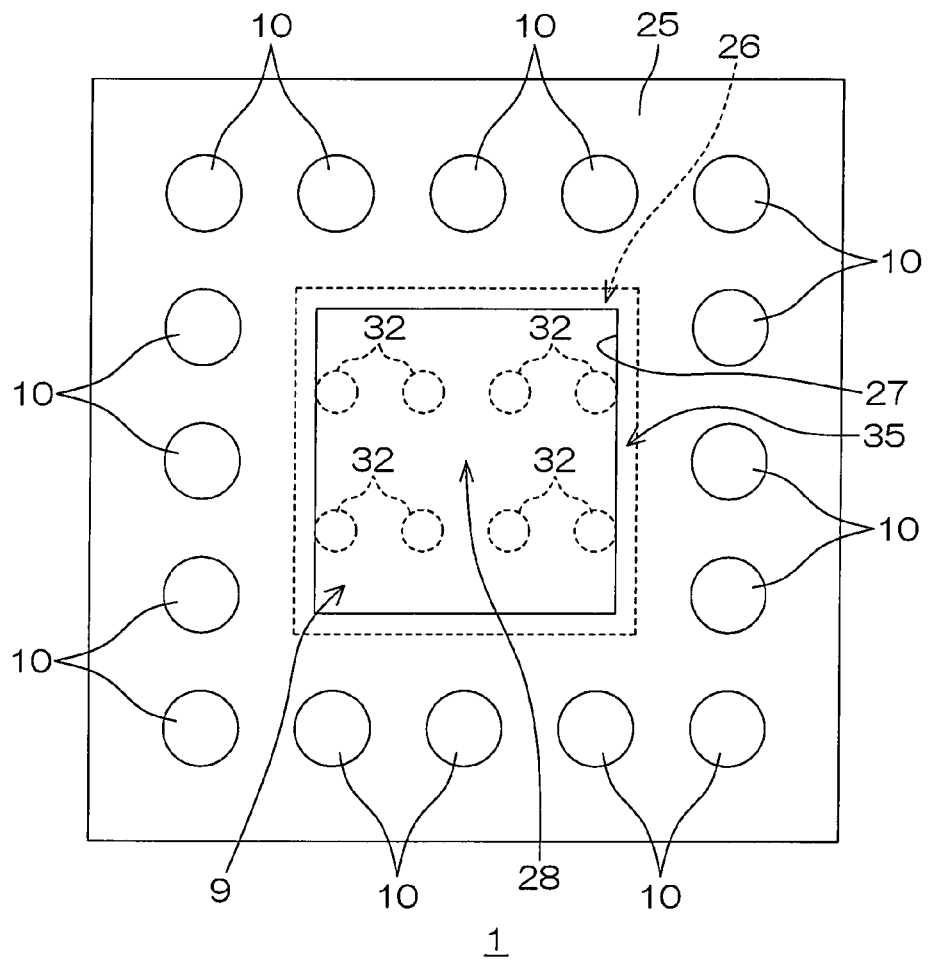
FIG. 9 is a schematic sectional view illustrating a surface of the semiconductor device of FIG. 8 to be opposed to a mount board.

FIG. 5 is a schematic plan view illustrating a surface of the semiconductor device of FIG. 4A to be opposed to a mount board. In FIGS. 4A, 4B and 5, components corresponding to those shown in FIGS. 1 and 2 will be denoted by the same reference characters as in FIGS. 1 and 2, and components each having the same construction as in FIGS. 1 and 2 will not be explained.

In FIG. 4A, the solder resist portion 25 has a heat dissipation opening 27 which exposes a center portion 28 of the thermal pad 9, and terminal openings 29 which respectively expose the external terminals 10.

A peripheral edge 35 of the heat dissipation opening 27 is located on a peripheral portion 26 of the thermal pad 9.

Since the thermal pad 9 is mostly exposed from the heat dissipation opening 27, the heat generated by the semiconductor chip 3 is efficiently dissipated as in the case of the semiconductor device 1 shown in FIG. 1.

For formation of the solder resist portion 25 having these openings (the heat dissipation opening 27 and the terminal openings 29) on the other surface 5B of the insulative substrate 5, a solder resist is first applied over the entire other surface 5B of the insulative substrate 5. In turn, a mask film having openings corresponding to the heat dissipation opening 27 and the terminal openings 29 is transferred onto the solder resist. Then, the solder resist is patterned (etched) with the use of the mask film as a mask, whereby the solder resist portion 25 having the heat dissipation opening 27 and the terminal openings 29 is formed.

The mask film has a mask pattern in which the center of the opening for the heat dissipation opening 27 is spaced a predetermined distance from the center of each of the openings for the terminal openings 29. Therefore, a distance between the centers of the heat dissipation opening 27 and each of the terminal openings 29 formed by the patterning with the use of the mask film as the mask is constant.

Therefore, even if the mask film is transferred onto the solder resist in an offset relation with respect to the insulative substrate 5, a distance c between the center a of a portion of the thermal pad 9 exposed from the heat dissipation opening 27 and the center b of each of portions of the external terminals 10 exposed from the terminal openings 29 in FIG. 4A is equal to a distance f between the center d of a portion of the thermal pad 9 exposed from the heat dissipation opening 27 and the center e of each of portions of the external terminals 10 exposed from the terminal openings 29 in FIG. 4B.

That is, distances between the center of the portion of the thermal pad 9 exposed from the heat dissipation opening 27 and the centers of the portions of the external terminals exposed from the terminal openings 29 are constant.

As a result, the center of the portion of the thermal pad 9 exposed from the heat dissipation opening 27 is located in constant positional relation with respect to the lands 24 of the mount board 23 when the semiconductor device 1 is mounted on the mount board 23 with reference to the thermal pad 9. Therefore, the external terminals 10 are respectively reliably brought into contact with the lands 24.

In this embodiment, the thermal via 11 may include a plurality of via-hole conductor portions 32 as shown in FIGS. 6 to 9.

In the embodiment described above, the island 6 has substantially the same size as the semiconductor chip 3 as seen in plan, but may be greater or smaller than the semiconductor chip 3 as seen in plan.

The embodiment described above is directed to the semiconductor device employing the BGA package, but the present invention is applicable to a semiconductor device employing a so-called LGA (Land Grid Array) package in which a plurality of lands (external terminals each having a thin plate shape) are arranged on the other surface 5B of the insulative substrate 5.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2006-272126 filed in the Japanese Patent Office on Oct. 3, 2006, the disclosure of which is incorporated herein by reference.

What is claimed is:

1. A semiconductor device comprising:

a resin substrate;

an island provided on a first surface of the substrate;

a semiconductor chip die-bonded onto the island;

an internal terminal provided on the first surface of the substrate and electrically connected to the semiconductor chip;

an external terminal provided on a second surface of the substrate opposite from the first surface in opposed relation to the internal terminal;

an inter-terminal connection via extending through the substrate from the first surface to the second surface of the substrate to connect the internal terminal to the external terminal in an electrically conductive manner;

a thermal pad provided on the second surface of the substrate in opposed relation to the island;
a heat conduction portion extending through the substrate from the first surface to the second surface of the substrate to connect the island to the thermal pad in a thermally conductive manner;
a solder resist portion provided on the second surface of the substrate and having a heat dissipation opening which defines a gap with respect to an outer periphery of the thermal pad and a terminal opening which exposes the external terminal; and
a thermal terminal being in contact with the thermal pad, wherein the gap encompasses an entire periphery of the thermal pad and exposes both an edge side surface of the thermal pad and the second surface of the substrate, and
a sum of a height of the thermal pad and a height of the thermal terminal is substantially equal to a height of the external terminal.

2. A semiconductor device as set forth in claim 1, wherein the heat conduction portion includes:
a heat conduction opening extending through the substrate;
a heat conduction layer covering a side surface of the heat conduction opening; and
a thermally conductive material portion embedded in the heat conduction opening.

3. A semiconductor device as set forth in claim 2, wherein the heat conduction opening has an aspect ratio of 1.0 to 1.5 which is defined as a ratio of the thickness to the width of the opening.

4. A semiconductor device as set forth in claim 2, wherein the thermally conductive material portion is composed of metal materials, resin materials plated with a metal, or materials obtained by dispersing metal particles in a resin matrix.

5. A semiconductor device as set forth in claim 4, wherein the thermally conductive material portion is composed of a copper-containing material.

6. A semiconductor device as set forth in claim 1, wherein the heat conduction portion includes a plurality of heat conduction portions.

7. A semiconductor device as set forth in claim 1, further comprising a thermal terminal provided on a surface of the thermal pad opposite from the substrate and adapted to be connected to a ground electrode provided on a mount board when the semiconductor device is mounted on the mount board.

8. A semiconductor device as set forth in claim 1, wherein the island has substantially the same size as the semiconductor chip as seen in plan.

9. A semiconductor device as set forth in claim 1, wherein the thermal pad has substantially the same plan shape and thickness as the island.

10. The semiconductor device as set forth in claim 1, wherein the semiconductor device is a semiconductor device employing a BGA package.

11. The semiconductor device as set forth in claim 1, wherein the resin substrate is an insulative substrate.

12. The semiconductor device as set forth in claim 11, wherein the insulative substrate includes a glass epoxy resin substrate.

13. The semiconductor device as set forth in claim 1, further including a resin seal sealing the semiconductor chip and one surface of the substrate opposed to the semiconductor chip.

14. The semiconductor device as set forth in claim 1, wherein the semiconductor chip is connected to the island with a solder.

15. The semiconductor device as set forth in claim 14, wherein the solder is a high-melting point solder having a melting point of not lower than 260° C.

16. The semiconductor device as set forth in claim 1, further including a surface protective film covering an outermost surface of the semiconductor chip.

17. The semiconductor device as set forth in claim 16, further including a plurality of pads being exposed from the surface protective film.

18. The semiconductor device as set forth in claim 17, wherein the semiconductor device has a plurality of the inter terminals, and
the plurality of pads are respectively connected to the internal terminals via bonding wires.

19. The semiconductor device as set forth in claim 1, wherein the semiconductor chip is connected to the island in an electrically.

20. The semiconductor device as set forth in claim 1, wherein the thermal pad is composed of the same metal material as the island.

21. The semiconductor device as set forth in claim 20, wherein the metal material includes copper.

22. The semiconductor device as set forth in claim 1, wherein the external terminal has a ball shape and is composed of a metal material.

23. The semiconductor device as set forth in claim 1, wherein the external terminal includes a terminal composed of a solder.

24. The semiconductor device as set forth in claim 1, wherein the external terminal opposes to the internal terminal with the intervention of the substrate.

25. The semiconductor device as set forth in claim 1,
wherein the semiconductor device has a plurality of the external terminals, and
the external terminals are arranged as surrounding the thermal pad.

26. The semiconductor device as set forth in claim 1, wherein the external terminal projects from the solder resist.

27. The semiconductor device as set forth in claim 1, wherein the semiconductor device has a plurality of the external terminals, and
the external terminals are arranged alongside peripheral edges of the other surface of the substrate.

28. The semiconductor device as set forth in claim 1, wherein a rear surface of the semiconductor chip is kept at a ground potential.

29. The semiconductor device as set forth in claim 1, wherein the island is greater than the semiconductor chip as seen in plan.

30. The semiconductor device as set forth in claim 1, wherein the island is smaller than the semiconductor chip as seen in plan.

31. The semiconductor device as set forth in claim 1, wherein the semiconductor device has a plurality of the external terminals and is a semiconductor device employing an LGA package in which the external terminals each have a thin plate shape.

32. The semiconductor device as set forth in claim 31, wherein the external terminals are arranged on the other surface of the substrate.

33. The semiconductor device as set forth in claim 1, wherein a total of 16 external terminals are provided.

* * * * *